United States Patent
Fujiyoshi

(10) Patent No.: US 11,599,222 B2
(45) Date of Patent: Mar. 7, 2023

(54) DETECTION DEVICE

(71) Applicant: Alps Alpine Co., Ltd., Tokyo (JP)

(72) Inventor: Tatsumi Fujiyoshi, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 0 days.

(21) Appl. No.: 17/459,943

(22) Filed: Aug. 27, 2021

(65) Prior Publication Data

US 2021/0389842 A1 Dec. 16, 2021

Related U.S. Application Data

(63) Continuation of application No. PCT/JP2019/051274, filed on Dec. 26, 2019.

(30) Foreign Application Priority Data

Mar. 12, 2019 (JP) .............................. JP2019-044995

(51) Int. Cl.
*G06F 3/041* (2006.01)
*G06F 3/044* (2006.01)
*B62D 1/04* (2006.01)

(52) U.S. Cl.
CPC ............ *G06F 3/0418* (2013.01); *B62D 1/04* (2013.01); *G06F 3/044* (2013.01); *G06F 2203/04107* (2013.01)

(58) Field of Classification Search
CPC .......... G06F 3/0418; G06F 3/044; B62D 1/04
USPC ................................................. 345/173–174
See application file for complete search history.

(56) References Cited

U.S. PATENT DOCUMENTS

| | | | | |
|---|---|---|---|---|
| 2015/0286335 A1* | 10/2015 | Haga | ..................... | G06F 3/0444 345/174 |
| 2016/0004354 A1* | 1/2016 | Kremin | .................. | G06F 3/0446 345/174 |
| 2016/0062519 A1* | 3/2016 | Park | ....................... | G06F 3/0446 345/173 |
| 2016/0240684 A1* | 8/2016 | Yamazaki | ............... | H01L 21/47 |
| 2017/0139515 A1* | 5/2017 | Lee | ......................... | G06F 3/0443 |
| 2017/0254633 A1 | 9/2017 | Tanahashi et al. | | |
| 2019/0102010 A1* | 4/2019 | Knabenshue | ......... | G06F 3/0442 |
| 2019/0286261 A1* | 9/2019 | Neel | ........................ | G01D 5/24 |

(Continued)

FOREIGN PATENT DOCUMENTS

| | | |
|---|---|---|
| JP | H03-289715 | 12/1991 |
| JP | 2017-111598 | 6/2017 |
| JP | 2017-161494 | 9/2017 |

(Continued)

OTHER PUBLICATIONS

International Search Report from International Application No. PCT/JP2019/051274 dated Mar. 24, 2020.

*Primary Examiner* — Kwin Xie
(74) *Attorney, Agent, or Firm* — Beyer Law Group LLP

(57) ABSTRACT

This detection device includes a sensor electrode, a shield electrode, which has a parasitic capacitance between the sensor electrode and the shield electrode and is driven by an AC voltage, a detection circuit, which is electrically connected to the sensor electrode and the shield electrode and detects the electrostatic capacitance of the sensor electrode, a capacitor, which is connected in series between the sensor electrode and the detection circuit, and a bias unit, which biases the potential of the sensor electrode via a resistor.

7 Claims, 8 Drawing Sheets

(56) References Cited

U.S. PATENT DOCUMENTS

2019/0294297 A1    9/2019   Sasai et al.

FOREIGN PATENT DOCUMENTS

| | | |
|---|---|---|
| JP | 2017-188458 | 10/2017 |
| WO | 2018/116706 | 6/2018 |

* cited by examiner

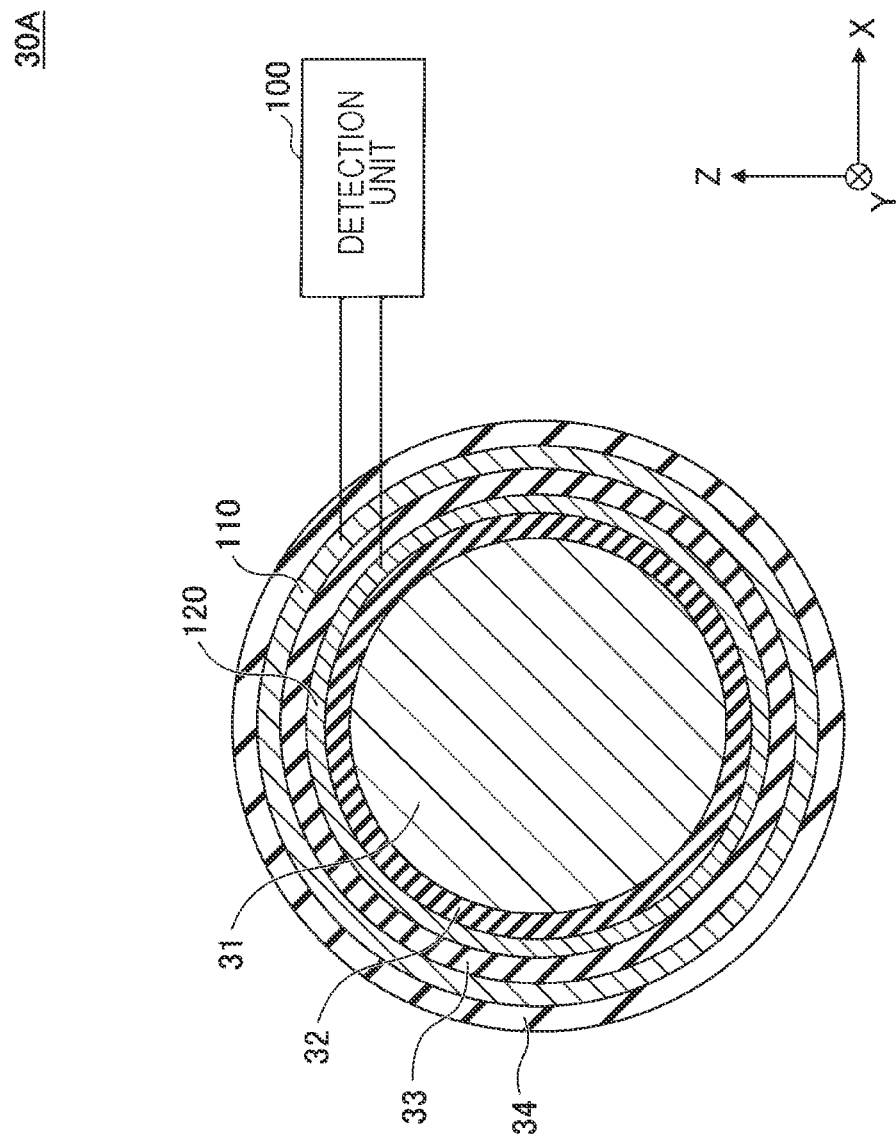

DETECTION DEVICE

CLAIM OF PRIORITY

This application is a Continuation of International Application No. PCT/JP2019/051274 filed on Dec. 26, 2019, which claims benefit of Japanese Patent Application No. 2019-044995 filed on Mar. 12, 2019. The entire contents of each application noted above are hereby incorporated by reference.

BACKGROUND OF THE INVENTION

1. Field of the Invention

The present invention relates to a detection device.

2. Description of the Related Art

In the related art, techniques of detecting contact with a driver's hand on a steering wheel of a vehicle have been devised. The detection is performed on the basis of a change of the electrostatic capacitance of a sensor electrode disposed in the steering wheel.

For example, Japanese Unexamined Patent Application Publication No. 2017-111598 discloses an electrostatic detection device which is capable of detecting a steering-wheel holding position on the basis of the electrostatic capacitance value of an electrostatic sensor unit disposed in the circumferential direction of the steering wheel.

However, in the technique described in Japanese Unexamined Patent Application Publication No. 2017-111598, the electrostatic sensor unit has a configuration in which multiple capacitors are connected in series. Thus, the electrostatic capacitance value detected by the electrostatic sensor unit is determined in accordance with both the degree of contact and the contact position. The "degree of contact" is defined as a value in accordance with the electrostatic capacitance value between the electrostatic sensor unit and a detection target (herein, a hand), and is determined by the contact area or the degree of being close.

Therefore, the technique described in Japanese Unexamined Patent Application Publication No. 2017-111598 fails to determine only the degree of contact or only the contact position with high accuracy. For example, when the electrostatic sensor unit described in Japanese Unexamined Patent Application Publication No. 2017-111598 has ten capacitors, each having a capacitance of 100 pF, assume the case in which the second capacitor has a touch capacitance of 5 pF due to a touch, and the case in which the sixth capacitor has a touch capacitance of 100 pF due to a touch. Although their degrees of contact and their contact positions are different from each other, their detected electrostatic capacitance values are substantially the same.

Improvement of linearity in the relationship between the degree of contact of a sensor electrode and the output voltage, which is generated by a detection circuit in accordance with the detected capacitance, (hereinafter simply referred to as "linearity") may cause improvement of the accuracy in detection of the degree of contact in the sensor electrode. However, if only a sensor electrode having a large electrostatic capacitance is used to improve the linearity, a signal, which is input from the sensor electrode to the detection circuit, has a too large voltage amplitude. This may cause saturation of the signal in the detection circuit.

SUMMARY OF THE INVENTION

The present invention provides a technique which relates to a detection device detecting the electrostatic capacitance of a sensor electrode, and which achieves improvement of the linearity without saturation of a signal in the detection circuit.

A detection device according to an embodiment includes a sensor electrode, a shield electrode, a detection circuit, a capacitor, and a bias unit. The shield electrode has a parasitic capacitance between the sensor electrode and the shield electrode, and is driven by an alternating-current voltage. The detection circuit is electrically connected to the sensor electrode and the shield electrode, and detects the electrostatic capacitance of the sensor electrode. The capacitor is connected in series between the sensor electrode and the detection circuit. The bias unit biases the potential of the sensor electrode via a resistor.

According to an embodiment, in a detection device which detects the electrostatic capacitance of a sensor electrode, the linearity between the degree of contact and the output voltage, which is generated by the detection circuit in accordance with the detected capacitance, may be improved without saturation of a signal in the detection circuit.

BRIEF DESCRIPTION OF THE DRAWINGS

FIG. 8 is a sectional view along VIII-VIII of the steering wheel illustrated in FIG. 7.

DESCRIPTION OF THE PREFERRED EMBODIMENTS

Figure 1:
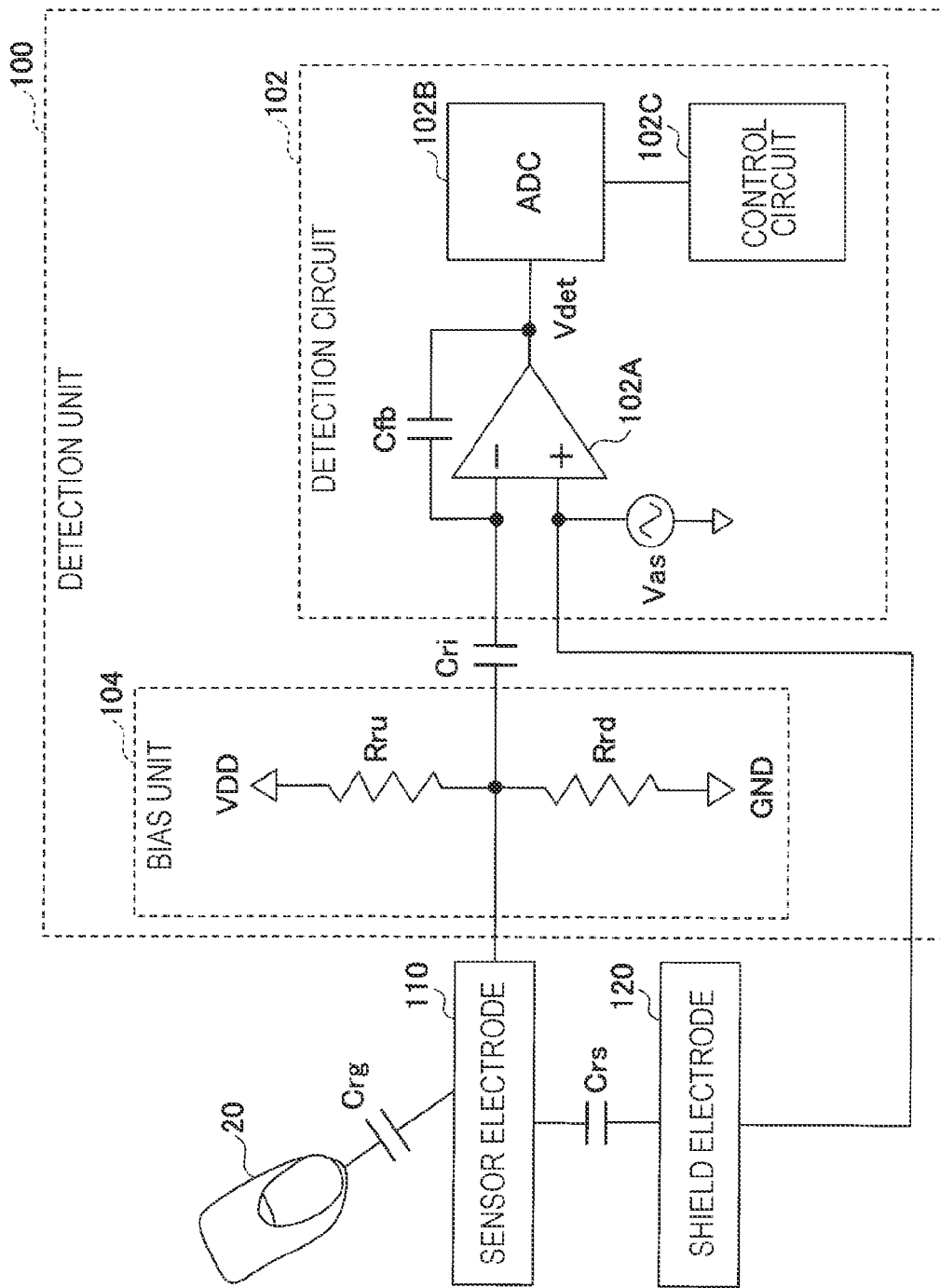
FIG. 1 is a diagram illustrating the configuration of a detection device according to a first embodiment.

Embodiments will be described below by referring to the drawings.

First Embodiment

FIG. 1 is a diagram illustrating the configuration of a detection device 10 according to a first embodiment. The detection device 10 illustrated in FIG. 1 is a device which detects contact with an operating body 20 (for example, a finger). As illustrated in FIG. 1, the detection device 10 includes a sensor electrode 110, a shield electrode 120, and a detection unit 100.

The sensor electrode 110 detects contact with the operating body 20. Specifically, the sensor electrode 110 is driven by an alternating current (AC) voltage supplied from a drive circuit. When the electrostatic capacitance changes due to contact with the operating body 20, the value of current changes in accordance with the change of the electrostatic capacitance. The change of the value of current is detected by a detection circuit 102 as contact with the operating body 20. As the sensor electrode 110, for example a plate-like conductor, a thin-film-like conductor, or a linear conductor may be used.

The shield electrode 120, which has a parasitic capacitance Crs between the sensor electrode 110 and the shield electrode 120, is driven by an AC voltage (an AC voltage which is in phase with the AC voltage supplied to the sensor electrode 110) supplied from an AC power supply Vas. For example, the shield electrode 120 reduces the parasitic capacitance with a body other than the operating body 20 which is to be detected, and blocks a leak of current from the sensor electrode 110 to the body other than the operating body 20, achieving suppression of reduction of the detection accuracy. As the shield electrode 120, for example, a plate-like conductor, a thin-film-like conductor, or a linear conductor may be used.

The detection unit 100 includes the detection circuit 102, a capacitor Cri, and a bias unit 104.

The detection circuit 102, which is electrically connected to the sensor electrode 110 and the shield electrode 120, detects the electrostatic capacitance of the sensor electrode 110. Specifically, the detection circuit 102 includes a capacitor Cfb, the AC power supply Vas, a differential amplifier 102A, an analog to digital converter (ADC) 102B, and a control circuit 102C.

The differential amplifier 102A has the non-inverting input terminal (+) connected to the shield electrode 120, and the inverting input terminal (−) connected to the sensor electrode 110. The differential amplifier 102A amplifies the voltage difference between the voltage value of the shield electrode 120, which is input from the non-inverting input terminal (+), and the voltage value of the sensor electrode 110, which is input from the inverting input terminal (−). The differential amplifier 102A then outputs an amplified differential signal Vdet, which indicates the amplified voltage difference, from the output terminal to the ADC 102B.

Between the sensor electrode 110 and the ADC 102B, the capacitor Cfb is disposed between the output and the inverting input terminal (−) of the differential amplifier 102A. The capacitor Cfb is disposed to integrate charge from the sensor electrode for conversion into a voltage signal as the amplified differential signal Vdet.

The ADC 102B converts the amplified differential signal Vdet, which is output from the differential amplifier 102A, from an analog signal to a digital signal. The ADC 102B outputs, to the control circuit 102C, the amplified differential signal Vdet, which has been converted into a digital signal.

The control circuit 102C detects contact with the operating body 20 on the basis of a change of the electrostatic capacitance (that is, a change of the value of current) occurring in the sensor electrode 110. For example, when the voltage value of the amplified differential signal Vdet, which is input from the ADC 102B, exceeds a given threshold, the control circuit 102C determines that the operating body 20 is in contact with the sensor electrode 110. In addition, the control circuit 102C is capable of determining the degree of contact with the operating body 20 in accordance with the voltage value of the amplified differential signal Vdet. As the detection unit 100, for example, an integrated circuit (IC) is used. The detection unit 100 is capable of outputting, to an external apparatus (not illustrated), a detection result of contact with the operating body 20. The detection result includes the degree of contact with the operating body 20. Thus, the external apparatus may perform a process in accordance with the degree of contact with the operating body 20.

The capacitor Cri is an exemplary "capacitor". The capacitor Cri is connected, in series, between the sensor electrode 110 and the detection circuit 102. The capacitor Cri is disposed to reduce the voltage amplitude of a signal, which is input from the sensor electrode 110 to the detection circuit 102, for avoidance of saturation of the voltage value in the detection circuit 102.

The bias unit 104 biases the potential of the sensor electrode 110 via resistors. Specifically, the bias unit 104 includes a resistor Rru and a resistor Rrd. The resistor Rru is connected, at its first end, between the sensor electrode 110 and the capacitor Cri, and is connected, at its second end, to a direct current (DC) power supply VDD. The resistor Rrd is connected, at its first end, between the sensor electrode 110 and the capacitor Cri, and is connected, at its second end, to the ground. That is, the bias unit 104 electrically connects the sensor electrode 110 to the DC power supply VDD via the resistor Rru, and thus biases the potential of the sensor electrode 110.

The detection device 10 according to the first embodiment includes the capacitor Cri disposed outside the detection circuit 102. This enables suppression of an increase in size of the detection circuit 102, and, at the same time, also enables reduction of the voltage amplitude of the amplified differential signal Vdet, achieving avoidance of saturation of the amplified differential signal Vdet in the detection circuit 102. The detection device 10 according to the first embodiment includes the bias unit 104, which biases the potential of the sensor electrode 110 via the resistors. Thus, the offset component of the current flowing from the sensor electrode 110 to the ground, or the offset component of the current flowing from the DC power supply VDD to the ground through the sensor electrode 110 may cause suppression of occurrence of the state in which the potential of the sensor electrode 110 is DC-inconstant due to arrangement of the capacitor Cri. Therefore, the detection device 10 according to the first embodiment enables improvement of the linearity without saturation of a signal in the detection circuit 102.

Second Embodiment

Figure 2:
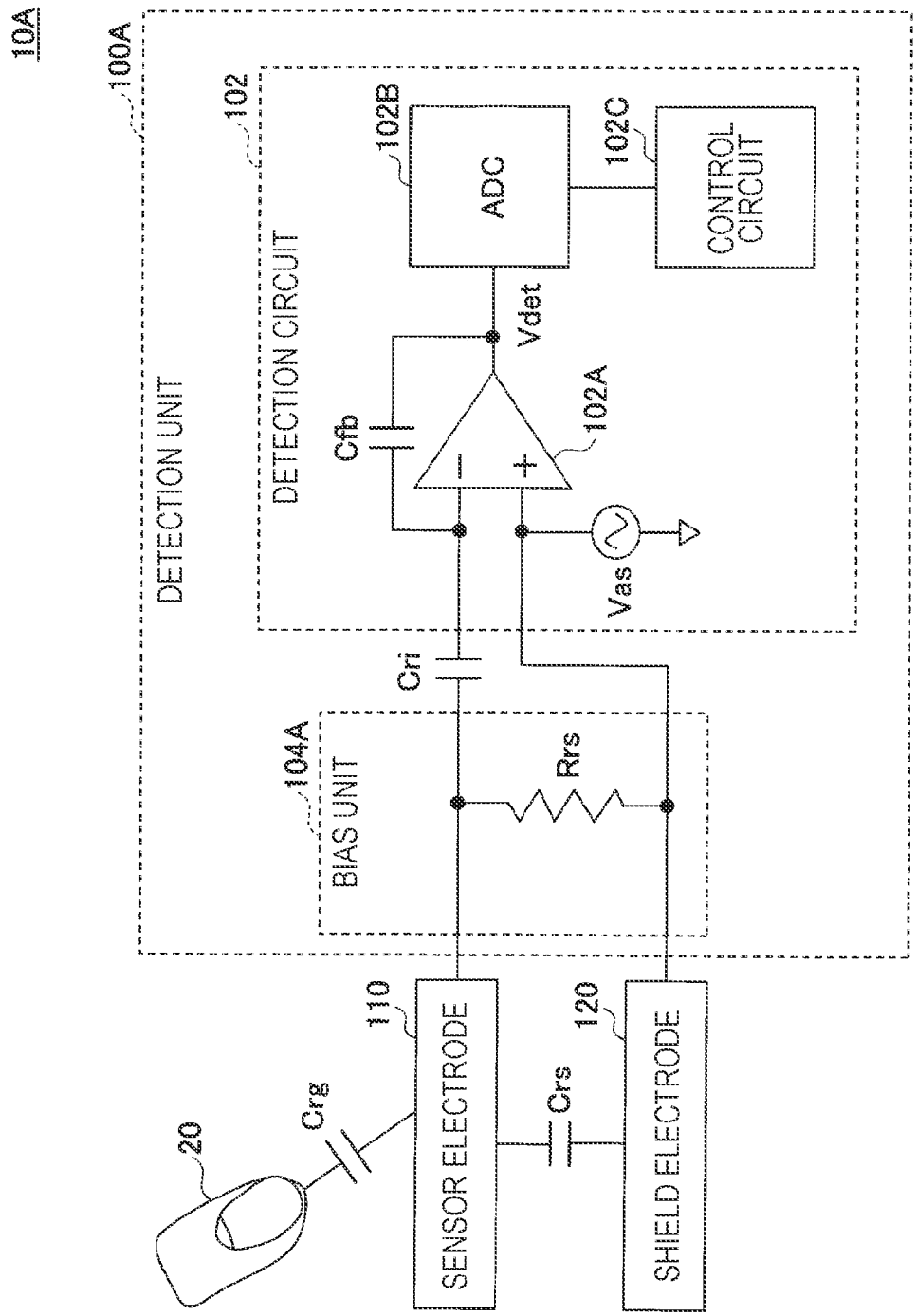
FIG. 2 is a diagram illustrating the configuration of a detection device according to a second embodiment.

FIG. 2 is a diagram illustrating the configuration of a detection device 10A according to a second embodiment. The detection device 10A illustrated in FIG. 2 is different from the detection device 10 illustrated in FIG. 1 in that, instead of the detection unit 100, a detection unit 100A is included. The detection unit 100A is different from the detection unit 100 in that, instead of the bias unit 104, a bias unit 104A is included.

The bias unit 104A biases the potential of the sensor electrode 110 via a resistor. Specifically, the bias unit 104A has a resistor Rrs. The resistor Rrs is connected, at its first end, between the sensor electrode 110 and the capacitor Cri, and is connected, at its second end, to the shield electrode 120. That is, the bias unit 104A electrically connects the sensor electrode 110 to the shield electrode 120 via the resistor Rrs, and thus biases the potential of the sensor electrode 110.

The detection device 10A according to the second embodiment includes the capacitor Cri disposed outside the detection circuit 102. This enables suppression of an increase in size of the detection circuit 102, and, at the same time, also enables reduction of the voltage amplitude of the amplified differential signal Vdet, achieving avoidance of saturation of the amplified differential signal Vdet in the detection circuit 102. The detection device 10A according to the second embodiment includes the bias unit 104A which biases the potential of the sensor electrode 110 via a resistor. This enables suppression of occurrence of the state in which the potential of the sensor electrode 110 is DC-inconstant due to arrangement of the capacitor Cri. Therefore, the detection device 10A according to the second embodiment enables improvement of the linearity without saturation of a signal in the detection circuit 102.

EXAMPLE

An embodiment example of the detection devices 10 and 10A according to the embodiments will be described below. In the present embodiment example, the voltage value of the differential voltage signal Vdet is measured by using each of the detection device 10 according to the first embodiment, the detection device 10A according to the second embodiment, and a detection device prepared as a comparison example. The detection device prepared as the comparison example has a configuration in which the capacitor Cri and the bias unit 104 are removed from the detection device 10. In the present embodiment example, a goal that the voltage amplitude of the differential voltage signal Vdet is to fall within the range of the power supply voltage (0 V to 5 V) is set.

Example Results

Figure 3:
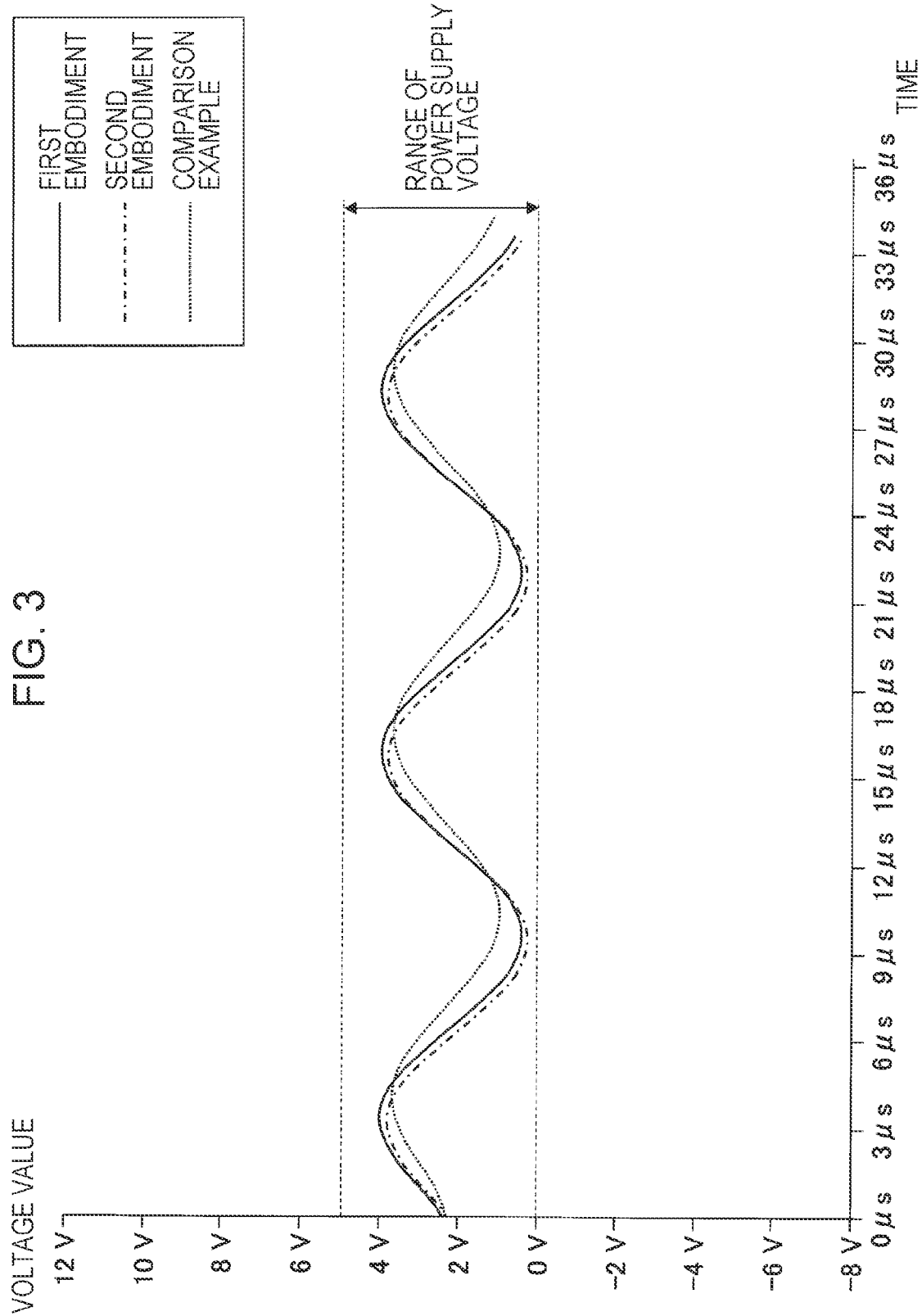
FIG. 3 is a diagram illustrating measurement results of the voltage value of a differential voltage signal (in the case of non-contact with an operating body) according to an embodiment example.
Figure 4:
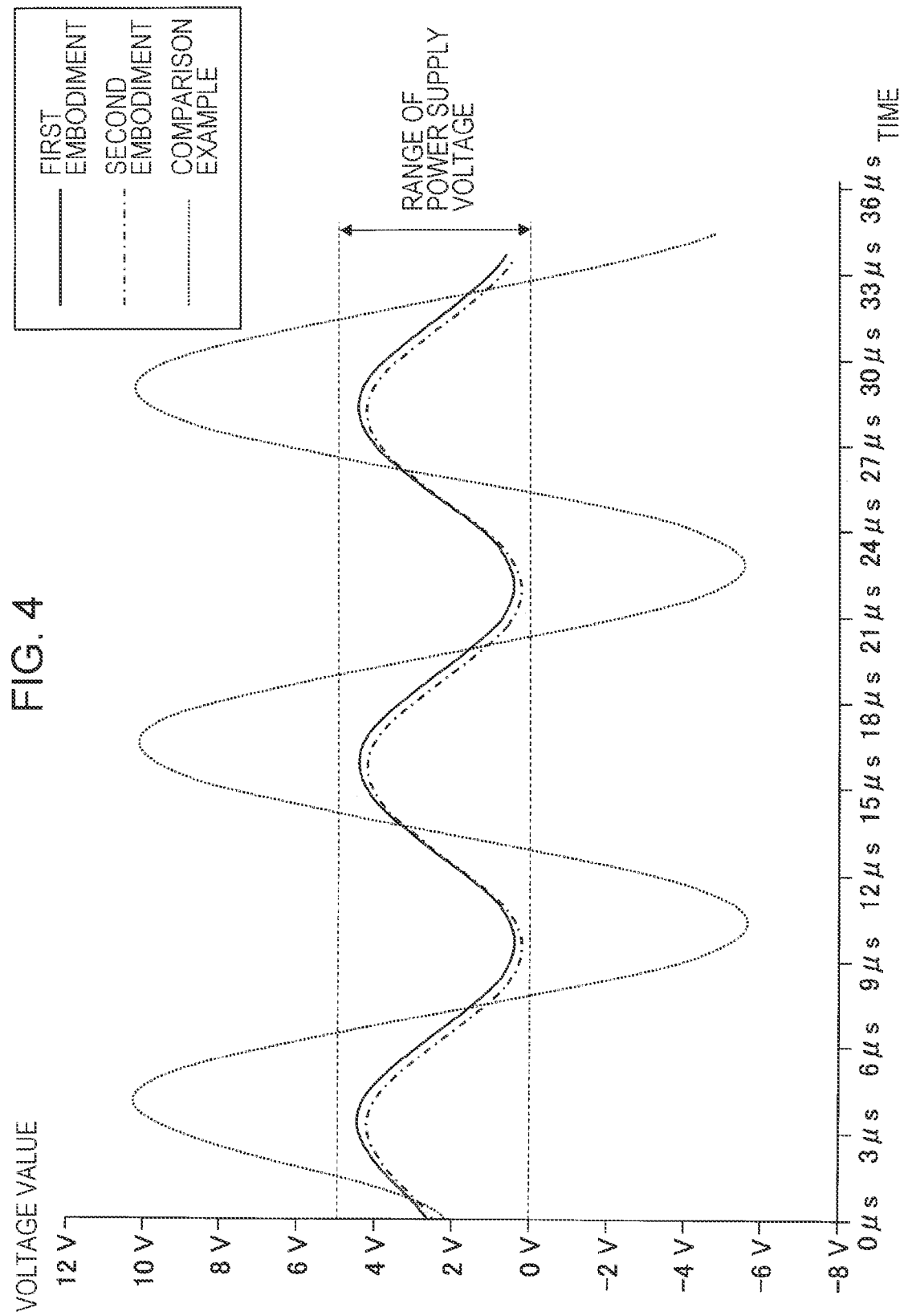
FIG. 4 is a diagram illustrating measurement results of the voltage value of the differential voltage signal (in the case of contact with an operating body) according to an embodiment example.

FIG. 3 is a diagram illustrating measurement results of the voltage value of the differential voltage signal Vdet (in the case of non-contact with the operating body 20) according to the embodiment example. FIG. 4 is a diagram illustrating measurement results of the voltage value of the differential voltage signal Vdet (in the case of contact with the operating body 20) according to the embodiment example. In FIGS. 3 and 4, the vertical axis represents the voltage value of the differential voltage signal Vdet, and the horizontal axis represents time. In FIGS. 3 and 4, a solid line indicates a measurement result of the detection device 10 according to the first embodiment. A long dashed short dashed line represents a measurement result of the detection device 10A according to the second embodiment. A dotted line indicates a measurement result of the detection device used as the comparison example. The dotted line illustrated in FIG. 4 indicates a wave form which is obtained through calculation under the condition that saturation does not occur in the range of the power supply voltage. Actually, saturation occurs in the range of the power supply voltage.

Figure 5:
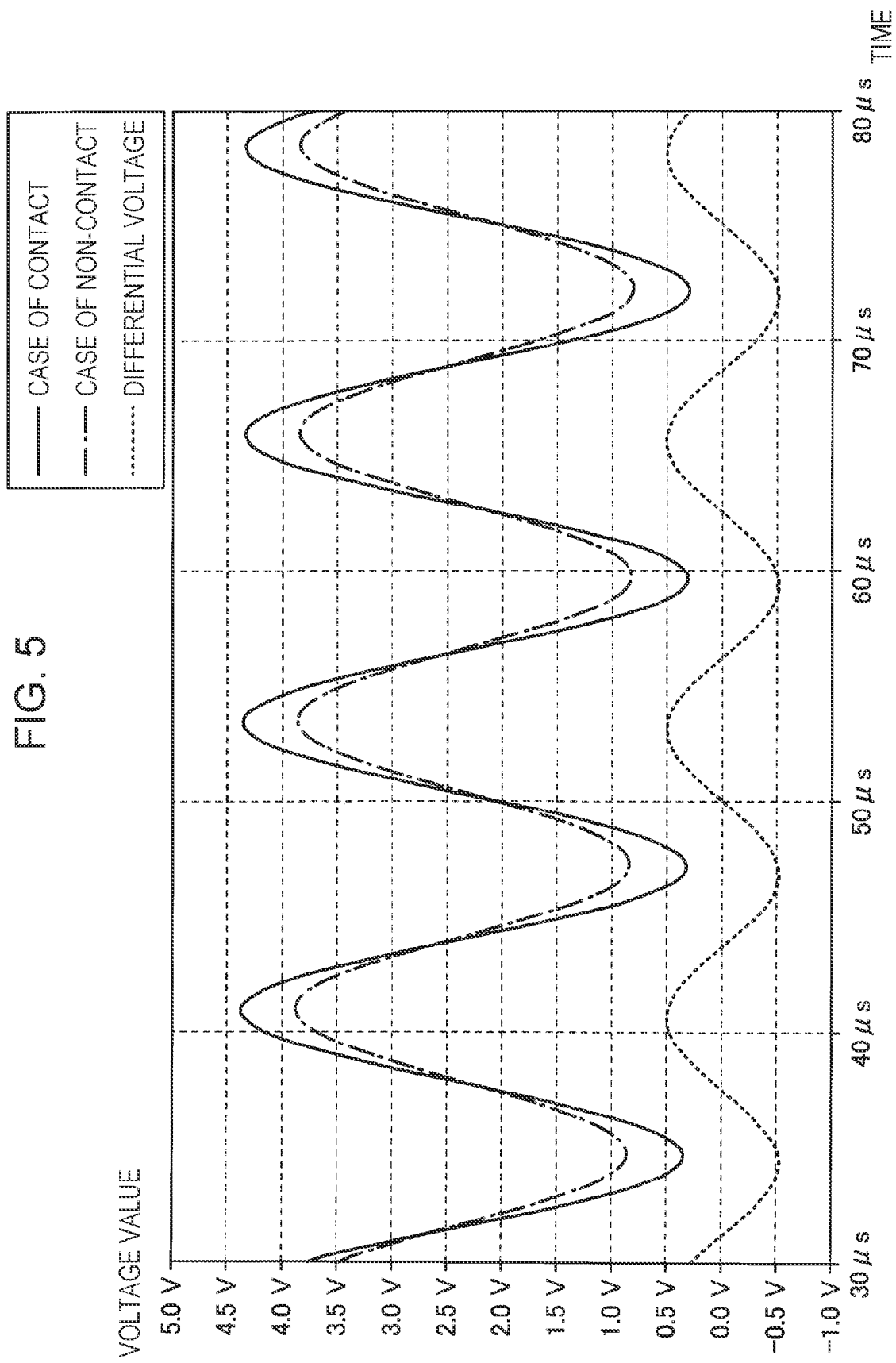
FIG. 5 is a diagram illustrating measurement results of the voltage value of the differential voltage signal in the cases of contact and non-contact with an operating body, and the differential voltage between these cases, according to the first embodiment.
Figure 6:
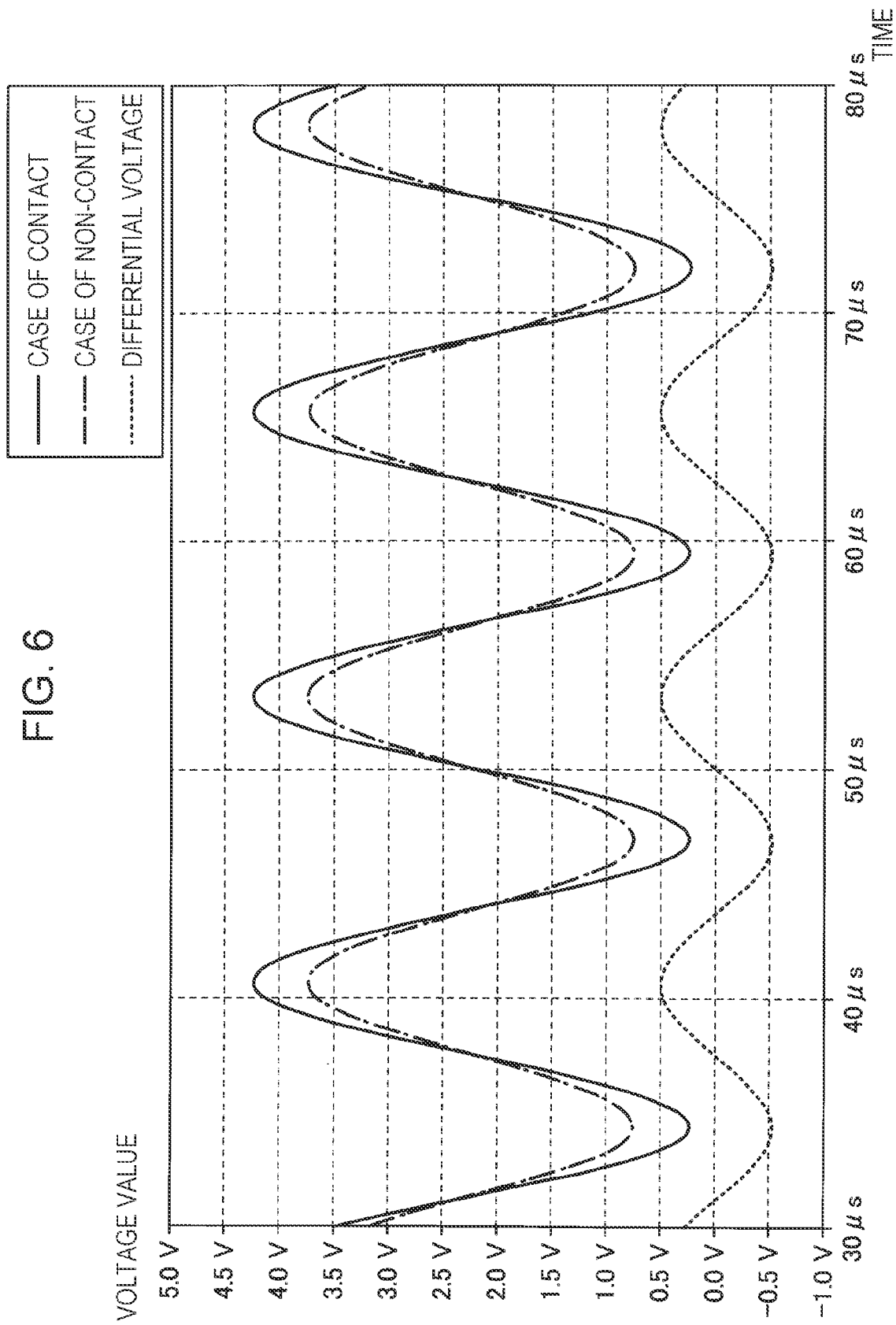
FIG. 6 is a diagram illustrating measurement results of the voltage value of the differential voltage signal in the cases of contact and non-contact with an operating body, and the differential voltage between these cases, according to the second embodiment.

FIG. 5 is a diagram illustrating the measurement results of the voltage value of the differential voltage signal Vdet in the cases of non-contact and contact with an operating body in the first embodiment and the differential voltage (ΔVdet) between these cases. FIG. 6 is a diagram illustrating measurement results of the voltage value of the differential voltage signal Vdet in the cases of non-contact and contact with an operating body in the second embodiment and the differential voltage (ΔVdet) between these cases. In FIGS. 5 and 6, a solid line indicates the voltage value in the case of contact. A long dashed short dashed line indicates the voltage value in the case of non-contact. A dotted line indicates the differential voltage (ΔVdet) between the voltage value in the case of contact and that in the case of non-contact. That is, each of FIGS. 5 and 6 is a single diagram illustrating, for facilitation of comparison, the differential voltage signals Vdet in the cases of contact and non-contact, which are illustrated in the corresponding one of FIGS. 3 and 4, and the differential voltage (ΔVdet) between these cases. As illustrated in FIGS. 5 and 6, it is found that, in both the detection devices, the voltage amplitude of the differential voltage signal Vdet in the case of contact with the operating body 20 is larger than that in the case of non-contact with the operating body 20 due to the influence of an electrostatic capacitance Chd caused by the operating body 20.

As illustrated in FIGS. 3 and 4, in both the case of non-contact with the operating body 20 and the case of contact with the operating body 20, the detection devices 10 and 10A may make the voltage amplitude of the differential voltage signal Vdet fall within the range of the power supply voltage (0 V to 5 V). In particular, the detection device 10A according the second embodiment may have the voltage amplitude of the differential voltage signal Vdet smaller than that of the detection device 10 according to the first embodiment. That is, arrangement of the bias unit 104A makes the voltage amplitude of the differential voltage signal Vdet smaller than that of arrangement of the bias unit 104.

In contrast, as illustrated in FIGS. 3 and 4, in the case of non-contact with the operating body 20, the detection device used as the comparison example may make the voltage amplitude of the differential voltage signal Vdet fall within the range of the power supply voltage (0 V to 5 V). However, in the case of contact with the operating body 20, the detection device fails to make the voltage amplitude of the differential voltage signal Vdet fall within the range of the power supply voltage (0 V to 5 V).

From the embodiment results, it is confirmed that the detection devices 10 and 10A, which include the capacitor Cri and the bias units 104 and 104A, respectively, may make the voltage amplitude of the differential voltage signal Vdet much smaller.

Application Example of the Detection Device 10

Figure 7:
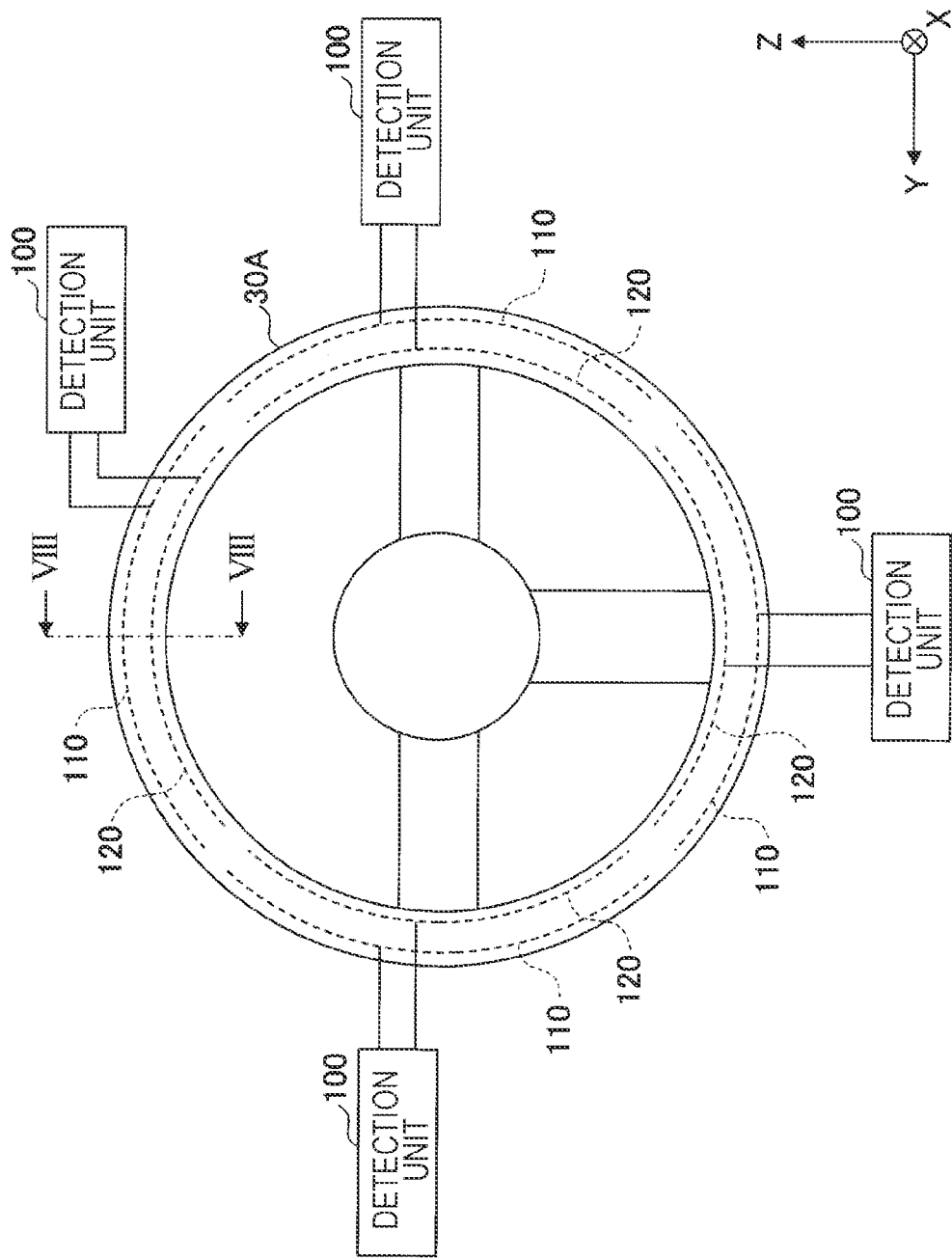
FIG. 7 is a diagram illustrating the configuration of a steering apparatus including detection devices according to an embodiment.

FIGS. 7 and 8 illustrate an application example in which the detection device 10 according to the first embodiment is used in a steering apparatus 30 of a vehicle. Instead of the detection device 10 according to the first embodiment, the detection device 10A according to the second embodiment may be included in the steering apparatus 30.

FIG. 7 is a diagram illustrating the configuration of the steering apparatus 30 including the detection device 10, according to an embodiment. The steering apparatus 30 illustrated in FIG. 7 includes a circular steering wheel 30A, four electrode pairs (the sensor electrode 110 and the shield electrode 120) disposed in the circumferential direction inside the steering wheel 30A, and four detection units 100 provided for the respective four electrode pairs. Each electrode pair is disposed in a range of about 90° in the steering wheel 30A to detect contact in the range.

FIG. 8 is a sectional view along VIII-VIII of the steering wheel 30A illustrated in FIG. 7. As illustrated in FIG. 8, the steering wheel 30A has a shape of cross-section in which multiple component members are disposed concentrically in multiple layers. The steering wheel 30A includes a core part 31, an insulating part 32, the shield electrode 120, an insulating part 33, the sensor electrode 110, and an outer covering part 34 in this sequence from the center of the shape of cross-section. That is, in the steering wheel 30A, the sensor electrode 110, having a circular shape in cross-section, and the shield electrode 120, having a circular shape of cross-section smaller than that of the sensor electrode 110, are embedded in the steering wheel 30A in the state in which the sensor electrode 110 and the shield electrode 120 are insulated from each other. For example, a metal material is used for the core part 31. For example, various insulating materials (such as synthetic resin and rubber) are used for the insulating part 32, the insulating part 33, and the outer covering part 34.

As illustrated in FIG. 8, the sensor electrode 110 and the shield electrode 120 are connected to the corresponding detection unit 100. Thus, the steering apparatus 30 uses the detection units 100 to detect the degree of contact with the operating body 20 (a deriver's hand) on the steering wheel 30A.

As described above, each detection unit 100 includes the capacitor Cri and the bias unit 104 or 104A, achieving improvement of the linearity without saturation of a signal in the detection circuit 102. Therefore, the detection unit 100 detects the degree of contact with the operating body 20 on the steering wheel 30A with high accuracy.

Each detection unit 100 is electrically connected to a controller (not illustrated) included in the vehicle, and may output, to the controller, a detection result of contact with the operating body 20. The detection result includes the degree of contact with the operating body 20. Thus, the controller may perform a process in accordance with the degree of contact with the operating body 20.

The detection units 100 may be provided outside the steering wheel 30A, or may be included in the steering wheel 30A.

As described above, the detection devices 10 and 10A according to the embodiments each include the sensor electrode 110, the shield electrode 120, which has the parasitic capacitance Crs between the sensor electrode 110 and the shield electrode 120 and which is driven by an AC voltage, the detection circuit 102, which is electrically connected to the sensor electrode 110 and the shield electrode 120 and which detects the electrostatic capacitance of the sensor electrode 110, the capacitor Cri (capacitor), which is connected in series between the sensor electrode 110 and the detection circuit, and the corresponding one of the bias units 104 and 104A, which biases the potential of the sensor electrode 110 via a resistor.

Thus, the detection devices 10 and 10A according to the embodiments reduce the voltage amplitude of the amplified differential signal Vdet so as to avoid saturation of the amplified differential signal Vdet in the detection circuit 102. The detection devices 10 and 10A according to the embodiments, which include the bias units 104 and 104A, respectively, biasing the potential of the sensor electrode 110 via resistors, may suppress occurrence of the state in which the potential of the sensor electrode 110 is DC-inconstant due to arrangement of the capacitor Cri. Therefore, the detection devices 10 and 10A according to the embodiments may improve the linearity without saturation of a signal in the detection circuit 102.

The embodiments of the present invention are described in detail above. The present invention is not limited to these embodiments. Various modifications or changes may be made in the scope of the gist of the present invention described in claims.

For example, the detection devices 10 and 10A according to the embodiments may be provided for any objects, not limited to a steering wheel, as long as the objects are at least targets of detection of contact with an operating body.

In the application example, the steering wheel 30A includes four electrode pairs. This is not limiting. The steering wheel 30A may include three electrode pairs or less, or five electrode pairs or more. In the application example, a single detection unit 100 is provided for a single electrode pair. This is not limiting. A single detection unit 100 may be provided for multiple electrode pairs.

What is claimed is:

1. A detection device comprising:
   a sensor electrode, an operating body causing an electrostatic capacitance of the sensor electrode to change;
   a shield electrode driven by an alternating-current voltage, the shield electrode having a parasitic capacitance formed between the sensor electrode and the shield electrode;
   a detection circuit electrically connected to the sensor electrode and the shield electrode, and configured to detect the electrostatic capacitance of the sensor electrode;
   a capacitor connected in series between the sensor electrode and the detection circuit; and
   a bias unit that biases a potential of the sensor electrode via a resistor,
   wherein the detection circuit includes a differential amplifier having a non-inverting input terminal and an inverting input terminal, the shield electrode being connected to the non-inverting input terminal, while the sensor electrode is connected to the inverting input terminal only via the capacitor.

2. The detection device according to claim 1, wherein the bias unit biases the potential of the sensor electrode by electrically connecting the sensor electrode to the shield electrode via the resistor.

3. The detection device according to claim 1, wherein the bias unit biases the potential of the sensor electrode by electrically connecting the sensor electrode to a direct-current power supply via the resistor.

4. The detection device according to claim 1, wherein the sensor electrode and the shield electrode are disposed in a steering wheel.

5. The detection device according to claim 3, wherein the bias unit includes another resistor electrically connected between the sensor electrode and a ground.

6. The detection device according to claim 1, wherein a change in the electrostatic capacitance of the sensor electrode is input to the detection circuit as a voltage signal,
   and wherein the capacitor is configured to reduce an amplitude of the voltage signal input to the detection circuit.

7. The detection device according to claim 1, wherein the detection circuit includes a differential amplifier configured to amplify a difference between a voltage signal from the shield electrode and a voltage signal from the sensor electrode, thereby outputting an amplified differential signal,
   and wherein the capacitor is configured to reduce an amplitude of the voltage signal from the sensor electrode, thereby preventing saturation of the amplified differential signal.

* * * * *